United States Patent
Plojhar et al.

(10) Patent No.: US 12,095,420 B2
(45) Date of Patent: Sep. 17, 2024

(54) RC TIME BASED LOCKED VOLTAGE CONTROLLED OSCILLATOR

(71) Applicant: SEMICONDUCTOR COMPONENTS INDUSTRIES, LLC, Scottsdale, AZ (US)

(72) Inventors: Jan Plojhar, Mokra Horakov (CZ); Lucas Emiel Elie Vander Voorde, Heindonk (BE); Pavel Mares, Rajhrad (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/322,077

(22) Filed: May 23, 2023

(65) Prior Publication Data
US 2023/0299718 A1   Sep. 21, 2023

Related U.S. Application Data

(63) Continuation of application No. 17/095,117, filed on Nov. 11, 2020, now Pat. No. 11,677,354.

(51) Int. Cl.
*H03B 5/12* (2006.01)
*H03F 3/45* (2006.01)
*H03K 5/00* (2006.01)
*H03L 7/00* (2006.01)

(52) U.S. Cl.
CPC ......... *H03B 5/1237* (2013.01); *H03B 5/1271* (2013.01); *H03B 5/129* (2013.01); *H03B 5/1293* (2013.01); *H03F 3/45475* (2013.01); *H03K 5/00006* (2013.01); *H03L 7/00* (2013.01)

(58) Field of Classification Search
CPC .... H03B 5/1237; H03B 5/1271; H03B 5/129; H03B 5/1293; H03B 2201/031; H03F 3/45475; H03K 5/00006; H03K 5/08
See application file for complete search history.

(56) References Cited

U.S. PATENT DOCUMENTS

| | | | |
|---|---|---|---|
| 5,982,241 | A | 11/1999 | Nguyen et al. |
| 11,115,036 | B1 | 9/2021 | Zhao et al. |
| 2002/0041217 | A1 | 4/2002 | Crofts et al. |
| 2019/0235566 | A1 | 8/2019 | Ensafdaran |
| 2019/0268008 | A1* | 8/2019 | Khoury ................. H03L 7/0995 |
| 2020/0313616 | A1 | 10/2020 | Tsuji |

(Continued)

OTHER PUBLICATIONS

U.S. Appl. No. 17/096,085, Non-Final Office Action, date Feb. 22, 2022.

(Continued)

*Primary Examiner* — Jeffrey M Shin
(74) *Attorney, Agent, or Firm* — Brake Hughes Bellermann LLP

(57) ABSTRACT

Circuits and processes for locking a voltage-controlled oscillator (VCO) at a high frequency signal are described. A circuit may include a voltage-controlled oscillator configured to generate a high frequency signal based on a control signal, a dummy load parallel to the voltage-controlled oscillator and configured to receive the control signal via a switch, and a digital-to-analog converter coupled to the voltage-controlled oscillator where the control signal is generated based on an output of the digital-to-analog converter.

17 Claims, 1 Drawing Sheet

(56) References Cited

U.S. PATENT DOCUMENTS

2020/0366241 A1   11/2020  Tsuji
2021/0273644 A1*  9/2021  Wen ........................ H03L 7/107

OTHER PUBLICATIONS

Jung et al., "A 1.08-nW/kHz 13.2-ppm/°C Self-Biased Timer Using Temperature-Insensitive Resistive Current," IEEE Journal of Solid-State Circuits, vol. 53, No. 8, Aug. 2018.
U.S. Appl. No. 17/095,117, filed Nov. 11, 2020.

* cited by examiner

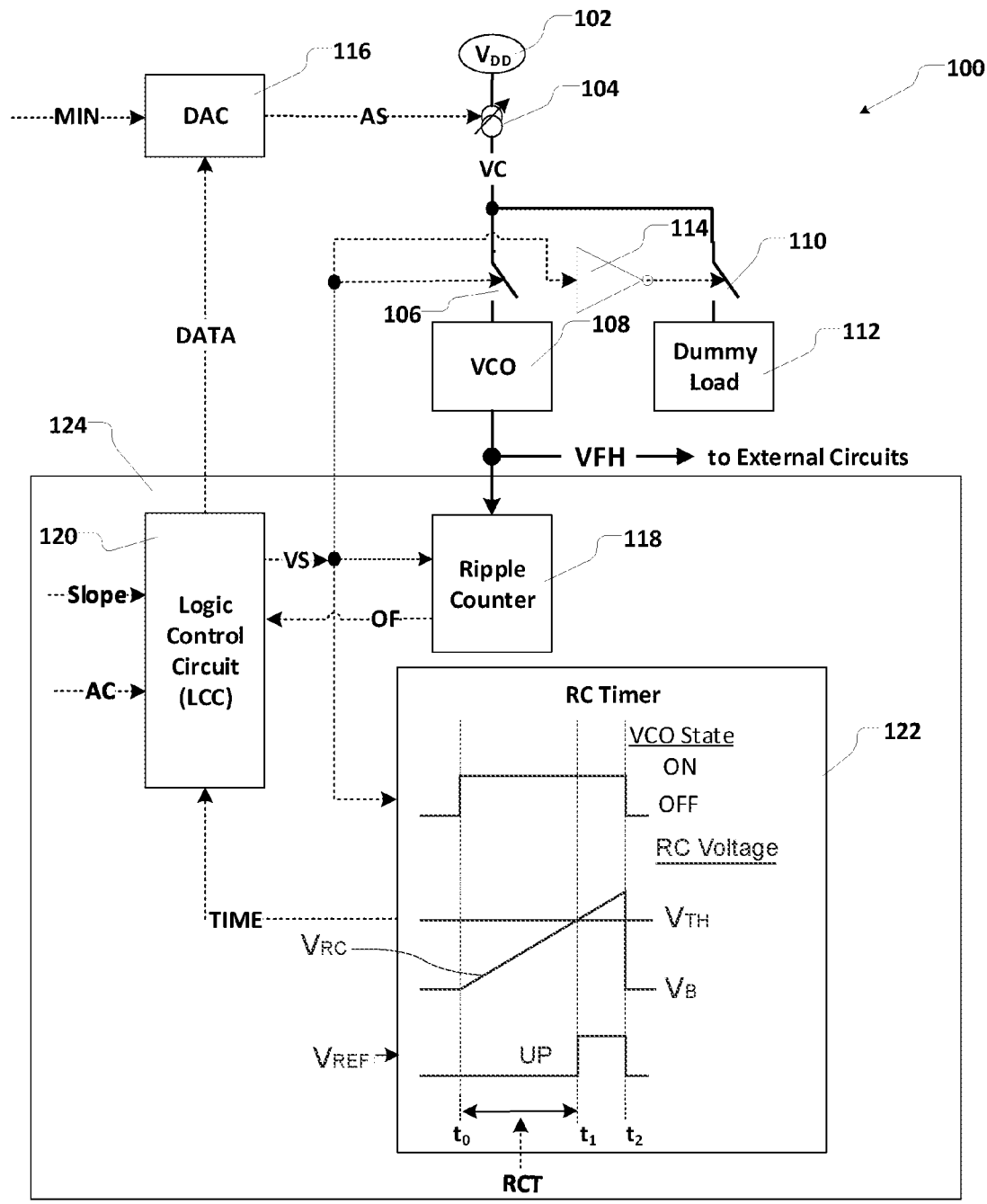

RC TIME BASED LOCKED VOLTAGE CONTROLLED OSCILLATOR

CROSS REFERENCE TO RELATED APPLICATIONS

This application is a continuation application of U.S. patent application Ser. No. 17/095,117, filed Nov. 11, 2020, which claims priority to and the benefit of U.S. Provisional Application No. 63/052,167, filed on Jul. 15, 2020, these applications are incorporated by reference herein in their entireties.

The present application also relates to U.S. application Ser. No. 17/095,085, which was co-filed herewith on Nov. 11, 2020, in the name of inventors Lucas Emiel Elie Vander Voorde and Jan Plojhar, is entitled "Timing Circuit for Locking a Voltage Controlled Oscillator to a High Frequency by Use of Low Frequency Quotients and Resistor to Switched Capacitor Matching", (herein, the "Resistor to Switched Capacitor Embodiments"), the entire contents of which are incorporated herein by reference.

TECHNICAL FIELD

The technology described herein generally relates to timing circuits. The technology also generally relates to locking voltage controlled oscillators at high frequencies. The technology described herein also relates to the use of digital components to lock voltage controlled oscillators at high frequencies. The technology described also relates to controller area network transmitters.

BACKGROUND

As is commonly appreciated, Controller Area Network (CAN) communications commonly use two signal wires. The communications are sent as fully differential signals in order to provide robust data integrity, generate minimal electromagnetic radiation, and negate use of cable shielding. CAN is commonly used in automobiles and other implementations. CAN signals are commonly generated by a transceiver based on timing signals received from, for example, a crystal oscillator, a voltage controlled oscillator (VCO), a combination thereof, or otherwise.

It is appreciated that when the paired CAN lines transmit differential signals with different voltage potentials, a common mode signal may occur on the transmission line. For example, the common mode signal may arise when the voltage on a "P" line plus the voltage on an "N" line is not constant over time. When arising, the common mode signal may result in an emission of undesired electromagnetic energy.

To provide nicely differential signals in a signal transmitted on a CAN, is desirably symmetrical—e.g., avoids sharp voltage peaks and the like. To generate symmetrical transmitted signals, high frequency timing signals are often used. At high frequencies, such as those greater than one-hundred megahertz (100 MHz), the generation of such timing signals by a VCO, is often difficult, with conventional approaches commonly including the use of external oscillators, phased-lock loops with lower frequency source clocks, and the like.

Further, it is to be appreciated that a symmetrical transmitted signal, such as one shaped as a raised cosine for use on a CAN, commonly uses a lower emitted energy content. The shaping of a transmitted signal depends, in large part, on the frequency of the timing signal used. A high frequency timing signal enables a transceiver to shape the transmitted signal without any time used for signal shaping being time consuming, where "time consuming" is determined, for example, in view of a given data rate for a given CAN line. For example, an amount of time used in shaping a transmitted signal should not interfere with a given data/symbol rate used.

Commonly, a maximum slope time is commonly used to define the slowest "raised cosine" frequency at which the data/bit rate can be achieved in a transmitted signal on a CAN. If a transmitted signal, has a steep edge, even a slight phase difference can arise between two CAN lines. Further, the transmitted signal, desirably will approximate a raised cosine waveform. When a raised cosine waveform is not used, even subtle differences can result in the transmitted signals and, thereby, in undesired electromagnetic radiation being emitted in the transmitted signal.

It is appreciated that a given transmitted signal on a CAN may be generated by a transceiver as a piecewise approximation of the raised cosine waveform. As the number of steps increases, with more steps resulting in smaller steps, the approximated raised cosine waveform takes an ever better form. Implementations of circuits for generating such transmitted signals are often limited by switching speeds in a driver, with a design choice often being made between speed and accuracy. Accordingly, a high frequency timing signal is often used to generate the smaller steps used by a transceiver to generate a transmitted signal on a CAN.

Further, current systems often result in timing signals that have significant spikes at, or about, a center frequency. When the center frequency is at a low frequency, the resulting spikes can result in the generation of undesired electromagnetic radiation by the timing signal. Thus, a need exists for VCO circuits that generate symmetrical, high frequency timing signals for use in CAN and other implementations.

Accordingly, circuits and methods are needed which address these and other concerns.

SUMMARY

The various implementations of the present disclosure describe circuits and methods for locking VCOs to high frequencies based on comparisons between pulse counts arising in a high frequency signal versus an analog timer, such as one configured using a resistor to capacitor circuit. The various implementations may also provide for a timing circuit which can be repeatedly configured between on and off states and with minimal, if any, interruption in high frequency signals output by a VCO.

In accordance with at least one implementation of the present disclosure, a circuit may include an adjustable current converter, coupled at an input terminal to a power source, operable to output a control signal (VC) at an output terminal. A first switch may be coupled to the adjustable current converter and to a voltage controlled oscillator (VCO). The VCO may be operable, when in an "ON" state, to receive the control signal and output a high frequency signal (VHF). A digital filter may be coupled to the VCO and operable to receive the high frequency signal VHF. Based on the received VHF signal, the digital filter may generate a data signal having a data value. The circuit may also include a digital-to-analog converter (DAC) operable to receive the data signal from the digital filter and, based on the data value, output an adjustment signal to the adjustable current converter. The adjustable current converter may adjust the control signal based on the adjustment signal received from the DAC.

The circuit may include a second switch coupled to the output terminal of the adjustable current converter and a dummy load coupled to the second switch. The dummy load may dissipate energy in the control signal VC when the VCO is in an off state. When the first switch is in an open state, the second switch is in a closed state. The VCO may provide a VCO impedance to the control signal VC. The dummy load may provide a dummy load impedance to the control signal VC. The VCO impedance may be substantially equal to the dummy load impedance. The circuit may be enabled when the first switch is closed. The VCO outputs the high frequency signal VHF while the circuit is enabled.

The digital filter may include: a ripple counter operable to receive the high frequency signal VHF, an RC timer, and a logic control circuit (LCC) operable to output a switching signal (VS) substantially simultaneously to the first switch. An inverter may be coupled to a second switch, to the ripple counter, and to the RC timer. The switching signal VS may include, at any given time, one of an enable signal and a disable signal. While the enable signal is included in the switching signal VS, the first switch is closed. The VCO may receive the control signal VC from the adjustable current converter and outputs the high frequency signal VHF having a given period.

While the enable signal is included in the switching signal VS, the ripple counter may divide the high frequency signal to generate a low frequency signal. The ripple counter may also count a number of pulses in the low frequency signal until an overflow condition is satisfied. When the overflow condition is satisfied, the ripple counter may output an overflow signal of to the LCC.

While the enable signal is included in the switching signal VS, the RC timer may increases a voltage in an RC circuit until a threshold voltage is reached and upon the threshold voltage being reached, output a time signal. While the enable signal is included in the switching signal VS, the LCC may detect receipt of a first to arrive of the overflow signal of and the time signal. When the overflow signal of arrives first, the LCC may decrease the data value. When the time signal arrives first, the LCC may increase the data value. An increase in the data value may result in an increase of the adjustment signal, which further results in an increase of the control signal, and which further results in an increase in a center frequency of the high frequency signal VHF output by the VCO. The LCC may be operable to adjust the data value based upon a window function used in determining the first to arrive of the overflow signal and the time signal. The ripple counter further may include "N" divider stages operable to divide the high frequency signal into a low frequency signal. The ripple counter may output the overflow signal when a number of pulses in the high frequency signal VHF exceeds a pulse threshold within a given period of the low frequency signal. The RC timer may include a resistor, a capacitor, and a comparator. While the RC timer is enabled, the resistor and capacitor may generate a timer voltage (VRC) that increases from a base voltage (VB) over time to at least a threshold voltage (VTH). The comparator may generate the time signal when the timer voltage (VRC) equals the threshold voltage (VTH). The threshold voltage (VTH) may be adjusted by an RC trim signal.

The data storage component may include at least one flip-flop. The LCC may include at least digital logic component operable to output a switching signal (VS) to the ripple counter, the RC timer, and the VCO. When the switching signal (VS) includes an enable signal, the LCC may instruct a first switch to couple the VCO with an adjustable current converter which outputs a control signal in view of an analog adjustment signal received from a digital-to-analog converter. The LCC may output the data value in a data signal to the digital-to-analog converter. The digital-to-analog converter may convert the data value from a digital formation into the analog adjustment signal.

At least one implementation may include a digital filter. The digital filter may include a ripple counter operable to receive a high frequency signal (VHF) from the VCO and output an overflow signal. An RC timer may be operable to output a time signal. A logic control circuit may be coupled to the ripple counter and to the RC timer. The logic control circuit may include at least one data storage component, a detector operable to detect a first receipt of the overflow signal from the ripple counter and the time signal from the RC timer, and a digital logic element. When the time signal arrives first, the detector may be operable to instruct the logic element to increase a data value. When the overflow signal arrives first, the detector may be operable to instruct the logic element to decrease the data value. Based on the data value, the VCO may adjust a center frequency of a high frequency signal (VHF).

At least one implementation of the present disclosure includes a process for locking a voltage controlled oscillator at a high frequency signal. The process may include coupling an adjustable current convert to a power source and outputting, by the adjustable current converter, a control signal (VC). The process may include closing a first switch to couple the adjustable current converter with a voltage controlled oscillator (VOC) and provide the control signal (VC) to the VCO. The process may include generating, by the VCO and based on the control signal (VC) a high frequency signal (VHF). The process may include receiving the high frequency signal (VHF) by a digital filter and generating, by the digital filter and based on the high frequency signal (VHF), a data signal having a data value. The process may include outputting the data signal to a digital-to-analog converter (DAC) and converting, by the DAC, the data value in the data signal into an analog adjustment signal. The process may include receiving, by the adjustable current converter, the analog adjustment signal from the DAC, and adjusting, by the adjustable current converter and based on the received analog adjustment signal, the control signal (VC). The process may include adjusting the control signal (VC) to modify a center frequency of the high frequency signal (VHF) generated by the VCO.

The generating of the data signal by the digital filter may include counting a number of pulses of the high frequency signal occurring within a given period for a low frequency signal until a pulse threshold is reached. The low frequency signal may generated as a result of a multi-staged division of the high frequency signal.

When the pulse threshold is reached, an overflow signal may be outputted, in an overflow signal, to a digital logic component. An analog timer circuit may increase a timer current from a base current. When the timer current equals a threshold current, the process may include operations including: outputting a time signal to the digital logic component; detecting, for a given period of the low frequency signal and by the digital logic component, a first to be received of the overflow signal and the time signal; increasing the digital count when the time signal is received before the overflow signal; and decreasing the digital count when the overflow signal is received before the time signal. The second switch may have an opposite state of the first switch. The second switch may provide a voltage potential substantially equivalent to an input voltage potential of the VCO. The closing of the second switch during non-enabled periods of the VCO may facilitate a providing of a given control signal to the VCO upon enabling of the VCO for a later arising period.

BRIEF DESCRIPTION OF THE DRAWINGS

The features, aspects, advantages, functions, modules, and components of the devices, systems and processes provided by the various implementations of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels, if any.

FIG. 1 is a schematic illustration of a timing circuit for locking a VCO output frequency at a high frequency based on timing signals generated by an RC circuit and a digital to analog converter and in accordance with at least one implementation of the present disclosure.

DETAILED DESCRIPTION

The various implementations described herein are directed to timing circuits for generating high frequency timing signals. For at least one implementation a timing circuit may be configured to lock a VCO to a high frequency. By using a high frequency, such as a frequency above one-hundred megahertz (100 MHz), voltage spikes that might otherwise result in undesired electromagnetic radiation ("EMR") may be avoided. EMR will commonly fall outside operating ranges for a vehicle or other device within which a CAN is being used. For at least one implementation, the circuits and methods may be used in a timing circuit to generate, by a VCO, timing signals in the three-hundred megahertz (300 MHz) to four-hundred megahertz (400 MHz) range. For at least one implementation, timing signals are generated that have a substantially center frequency of three-hundred and thirty-three megahertz (333 MHz). For at least one implementation, the timing signals generated by a VCO locked to provide a high frequency output signal, may be used by a transceiver to generate a transmitted signal containing one or more Data/"symbols" over a CAN. The high frequency output signal generated by a VCO locked to so provide a high frequency signal that may be used with other implementations and are not limited to use with CANs.

As shown in FIG. 1 and for at least one implementation of the present disclosure, a timing circuit 100 may include a voltage source 102, providing an input voltage "VDD", coupled to an adjustable current converter 104. The adjustable current converter 104 is further configured to generate a control signal "VC" that is provided, via a first switch 106, to a VCO 108 and, via a second switch 110, to a dummy load 112. The first switch 106 and the second switch 110 are configured in a parallel circuit relationship and have an inverse switching relationship, which may be provided by, for example and not by limitation, use of an inverter 114 and based on a then received switching signal "VS".

Based on the received control signal VC, the VCO 108 generates a high frequency signal "VHF." VHF is generated by the VCO based on the voltages received in the control signal VC. The high frequency signal VHF may be output as a timing signal for use by other devices in a given implementation, such as in a given CAN implementation. The principles of operation of VCOs are well known and are not otherwise described herein. Any known or later arising VCO technology may be used in implementations of the various implementations described herein. The VHF generally includes a symmetrical, repeating waveform that has a peak center frequency and multiple ripples. For at least one implementation, the high frequency signal VHF may arise over a bandwidth of approximately three-hundred and thirty-five megahertz (335 MHz) to three-hundred and fifty megahertz (350 MHz). Other ranges may be used for other implementations.

It is to be appreciated that when the first switch 106 is closed, the second switch 110 is opened and the VCO 108 receives the control signal VC from the adjustable current converter 104. This configuration is referred to herein as the VCO 108 being in an "ON" state and the switching signal VS providing an "Enable" signal, and the timing circuit 100 being in an "Enabled state". Likewise, when the first switch 106 is opened, the second switch 110 is closed, and the dummy load receives the control signal VC from the adjustable current converter 104. This configuration is referred to herein as the VCO 108 being in the "OFF" state and the switching signal VS providing a "Disable" signal and the timing circuit 100 being in a "Disabled state". Further, when the VCO 108 is ON, the VCO 108 outputs a high frequency signal VHF, which is further provided to external circuits, such as to a CAN circuit. When the VCO 108 is OFF, the VCO 108 does not output the high frequency signal VHF.

As further shown in FIG. 1, the adjustable current converter 104 receives an adjustment signal "AS" from a digital-to-analog converter (DAC) 116. Based upon current values of the adjustment signal AS, the adjustable current converter 104 adjusts the current level for the control signal VC such that the voltage potential provided to the VCO 108 may be adjusted. It is to be appreciated that while the timing circuit 100 is receiving the input voltage VDD from the voltage source 102, either the VCO 108 or the dummy load 112 is receiving the control signal VC. Accordingly, it is to be appreciated that while the timing circuit 100 is supplied with the input voltage VDD, the control signal VC may remain fixed at a given voltage level such that the VCO, when ON, generates a given high frequency signal VHF, and when OFF, the control signal VC is provided to the dummy load 112. Further, to facilitate a providing of a substantially constant control signal VC to the VCO, when it is ON, the input voltage potential of the dummy load 112 may be configured to be substantially equal to the input voltage potential of the VCO 108. By using matched input voltage potentials, the control signal VC current remains substantially the same when the timing circuit 100 is enabled and disabled. For at least one implementation, an impedance provided by the VCO 108 (herein, a "VCO impedance") is substantially equal to an impedance provided by the dummy load 112 (herein, a "dummy load impedance"). Such a configuration facilitates the selective use of the VCO, when VHF is needed, without inducing start-up delays which may arise with other embodiments including, but not limited to, the Resistor to Switched Capacitor Embodiments.

As further shown in FIG. 1, the high frequency signal VHF is further provided to a ripple counter 118. The ripple counter 118 may be configured to use "N" divider stages to divide the high frequency signal VHF into a low frequency signal having multiple pulses, one for each high frequency signal pulse. For at least one implementation, N equals four (4). For at least one implementation, the ripple counter 118 is configured to count an expected number of pulses (herein, a "pulse threshold") of the high frequency signal VHF arising over a given period of the low frequency signal. For at least one implementation, the pulse threshold is between twenty (20) to thirty (30) pulses. When the pulse threshold is reached before the given time period of the low frequency signal ends, an overflow signal "OF" is output by the ripple counter 118. For at least one implementation, the given time period may be sixty nanoseconds (60 ns).

As further shown, the ripple counter 118 is also configured to receive the switching signal VS. When the switching signal VS provides an Enable signal, the ripple counter 118 is activated and counts the pulses in the as-divided high frequency signal VHF for each low frequency signal period until either an overflow condition occurs, a reset timer times out, or when the control signal VS provides a Disable signal. The ripple counter 118 may be configured to reset its pulse count once a reset timer times out, such as once every sixty nanoseconds (60 ns). Other reset time intervals may be used for other implementations.

As further shown in FIG. 1, the overflow signal OF is provided to a logic control circuit (LCC) 120. The LCC 120 also outputs the switching signal VS to an RC timer 122. The RC timer 122 is configured to output, to the LCC 120, a "TIME" signal when a timer voltage $V_{RC}$ for a resistor-capacitor circuit (not shown) exceeds a given threshold voltage "$V_{TH}$". A reference voltage $V_{REF}$ may be used to charge the RC circuit while the switching signal VS provides the Enable signal and the timing circuit 100 is Enabled. As shown, when an ON state for the VCO begins, at an initial time "$t_0$", the RC timer is also Enabled and the timer voltage $V_{RC}$ increases from a base voltage $V_B$ until the threshold voltage $V_{TH}$ is reached at a threshold time "$t_1$". The time period from the initial time to the threshold time is identified herein as the "threshold time period ($t_0$-$t_1$)". The threshold time period (t0-t1) may be of a length of time that is long enough such that parasitic delays, arising from use of one or more resistor(s) and capacitor(s) in the RC timer 122, are neglectable in view of a time base for the RC timer 122. When a substantially constant reference current is provided to the RC timer 122, the time voltage $V_{RC}$ may increase as a substantially linear/ramp function of the resistor(s) and capacitor(s) chosen for the RC timer. A comparator may be used to determine when the threshold voltage $V_{TH}$ is reached. The resistors and capacitors may be chosen to effectively function as an analog timer which instructs the LCC 120 to limit the output of the high frequency signal VHF to within a given bandwidth and about a given center frequency. The RC timer 122 may be adjustable, for example by use of a variable resistor (not shown), whereby the threshold voltage VdTH and threshold time $t_1$ may be adjusted by use of an RC trim signal "RCT". The threshold time $t_1$ may need to be adjusted due to variances between characteristics of real resistors and capacitors used in any given implementation. The threshold time $t_1$ may also be adjusted to change a center frequency for the high frequency signal VHF over one or more periods. For example, an increase in the RCT will result in the high frequency signal VHF, for a next period, having a lower center frequency, while a decrease in RCT will result in the high frequency signal VHF, for a next period, having a higher center frequency. When a given period ends, when a reset timer times out, or when the switching signal VS provides a Disable signal, the RC timer 122 is returned to the base voltage $V_B$. As shown in FIG. 1 and for at least one implementation, the VCO 108, ripple counter 118, and RC timer 122 are enabled and disabled together and substantially simultaneously by use of a common switching signal VS.

Referring again to the LCC 120, the LCC 120 is configured to receive the overflow signal OF, the Time signal, a "Slope" signal, and an Auto-Correct "AC" signal. The LCC 120 is further configured to generate and output the switching signal VS and a DATA signal. The DATA signal is a digital signal, having a digital count (a "DATA value"), that is provided to the DAC 116 and which instructs the DAC 116 to generate an adjustment signal AS having a particular analog current value. By adjusting the DATA value, an adjustment in the analog adjustment signal AS occurs, which further results in an adjustment in the control signal VC and, finally, during an "ON" state, in an adjustment in the high frequency signal VHF generated by the VCO 108. Accordingly, it is to be appreciated that the various implementations of the present disclosure facilitate the locking of a VCO 108 to a given high frequency signal VHF by locking the LCC 120 to output a given DATA value, which ultimately results in the control signal VC being provided at a voltage potential.

To provide the DATA value, the LCC 120 may be configured to include one or more digital logic storage components, such as one or more flip-flops, which store the DATA value. The digital logic storage components may be persistent storage devices, such that the DATA value stored therein may be available for use whenever needed by the timing circuit 100. For example, when the timing circuit 100 is powered down, such as when a vehicle in which the timing circuit 100 may be used is turned off, the DATA value, as stored in the digital logic storage components, may persist and be available for substantially immediate use upon powering the vehicle on. The DATA value stored in the digital logic storage components and as provided to the DAC in the DATA signal may vary to adjust the operating characteristics of the timing circuit 100, when powered. For at least one implementation, adjustments to the DATA signal may occur by incremental increases or decreases in the DATA value; where an increase in the DATA value may result in a raising of a center frequency of the high frequency signal VHF output by the VCO 108 for a next arising operating period, and a decrease in the DATA value may result in a decrease in the center frequency of the high frequency signal VHF output by the VCO 108 for the next arising operation period.

The LCC 120 may include one or more digital logic elements configured to adjust the DATA value based upon comparisons between the overflow signal OF and the TIME signal. Non-limiting examples of such digital logic components include the use of AND, OR, NAND and other semiconductor gates, and the like. For at least one implementation, for a given period, the LCC 120 may be configured to increase the DATA value when the TIME signal is received before the OF signal. Likewise, when the OF signal is received before the TIME signal, the LCC 120 may be configured to decrease the DATA value. Accordingly, for at least one implementation, the LCC 120 may include an up/down counter that increments or decrements the DATA value based upon whether the OF signal or the TIME signal is received first, for a given period. It is to be appreciated that the increasing and decreasing of the DATA value may occur based on any given increment, such as one-to-one, one-to-two, on a scaled increment, on a variable increment, on a fixed increment, or otherwise. By use of scaled increments, the high frequency signal VHF may settle at a center frequency within less than five (5) pulses of the VHF. It is to be appreciated that over one or more periods, the high frequency signal VHF will settle at a given center frequency such that the number of pulses in a given period (e.g., twenty or thirty pulses) will occur within the threshold time period ($t_0$-$t_1$).

It is to be appreciated that if the DATA value does not vary from one period to a next period, the high frequency signal VHF will not contain ripples. For one or more implementations, ripples in the VHF may be generated for purposes of reducing EMR effects. Accordingly, the LCC 120 may be configured to use a threshold range for comparing when the OF signal and the TIME signal are respectively received. The LCC 120 may use the threshold to increase or decrease the DATA value about two or more values such that the VHF will fluctuate between two or more frequencies, thereby providing ripples in the VHF. For another implementation, the LCC 120 may be configured to use a window function which provides a tolerance range for use in determining whether the DATA value should be increased or decreased. It is to be appreciated that a window function or other function may be used by the LCC 120 to generate a VHF that does or does not contain ripples, that is within a given range of a center frequency, is fixed at a specific center frequency, or otherwise. In short, the LCC 120 may be configured to adjust the DATA value such that one or more properties of the VHF vary, ripple, remain constant, or otherwise over one or more periods.

As mentioned above, the LCC 120 may be configured to receive an auto-correct signal AC. The AC signal may be used to periodically generate the Enable signal when the CAN, or other external circuit(s), are not requiring use of the high frequency signal VHF. The AC signal may be used, for example, to minimize temperature variations that may arise from extended non-use periods of the VCO. It is to be appreciated that such temperature variations may affect the frequencies output by the VCO. By periodically Enabling the timing circuit 100, the DATA value may be adjusted, if/as needed, such that the control signal VC is stable—and results in the VCO 108, when Enabled, generating the center frequency for the high frequency signal VHF. The AC signal may be provided to the LCC 120 once a given interval, for example one to five milliseconds (1-5 ms) of the VCO 108 being Disabled. For another implementation, the AC signal may be provided to the LCC 120 based upon temperature readings for the VCO 108. For another implementation, the AC signal may be provided by the CAN based upon use thereof, as determined, for example, by a CAN controller, transmitter, or other CAN component.

As mentioned above, the LCC 120 may be configured to receive a SLOPE signal. The Slope signal may be provided to the LCC 120 by a CAN controller, transmitter, or other CAN component. For at least one implementation, the SLOPE signal may have a designated values (e.g., a high value) that is indicative of use of a CAN transmitter. While the SLOPE signal is high, the timing circuit 100 may be configured in the Enabled state. When the SLOPE signal returns to a low value (e.g., when the CAN transmitters are inactive), the circuit may be configured in the Disabled state.

As shown in FIG. 1, a combination of the LCC 120, the ripple counter 118, and the RC timer 122 effectively form a digital filter 124.

As shown, the DAC 116 may be configured to receive the digital DATA signal and output an analog adjustment signal AS. Any known or later arising DAC technology may be used. For at least one implementation, the DAC 116 may be further configured to receive a minimum starting frequency signal "MIN". MIN may be set at a digital value such that the timing circuit 100 will start at a minimum center frequency even if the DATA value is not persistently stored by the LCC 120. For at least one implementation, MIN may be provided to either the DAC 116, for example when an integrator resistor is built-in the DAC 116, or to the LCC 120.

At least one implementation of the present disclosure that uses a DAC 116 to generate the control voltage of the VCO 108 may be operable to stop and restart the VCO 108 quickly. By using the dummy load, the VCO 108 is able to restart quickly at a given frequency. In some embodiments, a frequency lock loop may be used to check a difference between a time generated as $2^N*1/VHF$ (a "time reference") versus an RC time constant for the RC timer 122. When the RC time constant is substantially equal to the time reference, any delays that may arise when the RC timer 122 is Enabled are insubstantial and the RC circuit becomes temperature stable. When the RC time constant is temperature stable, the high frequency signal VHF can be trimmed accurately by a DAC 116 that controls the VCO 108. The resolution of the DAC 116 may be chosen so that the up/down toggling of the input DATA value does not jitter too widely.

Implementations of a time based oscillator may be used to reduce radiation by stopping oscillation when no high frequency signal VHF is to be generated. The oscillator loop re-settles quickly after re-start due to the digital filter 124, the DAC 116, and the dummy load 112 being intermittently used when the VCO 108 is OFF. Some embodiments may use dedicated counter and comparison logic in order to start and stop the digital filter 124 with reduce or eliminated risk of setup and hold violations. Implementations of the present disclosure provide oscillators that use a VCO 108 that may be trimmed. Some implementations may use a three-point-three volt (3.3 V) gate voltage MOS transistors; however, other implementations may use other MOS transistors in combination with or in place of three-point-three volt (3.3 V) gate voltage MOS transistors. For example, another implementation may use a one-point-eight volt (1.8 V) transistor with a thinner gate dielectric. For one example, an implementation provides a three-hundred and fifty megahertz (350 MHz) local oscillator in a three-point-three volt (3.3 V) gate oxide MOS technology without the need of an additional external clock reference with an embedded slope synthesizer on chip that is able to synthesize slopes of approximately sixty nanoseconds (60 ns). Another example implementation provides a transmitter with an on-chip slope synthesizer that is able to synthesize slopes of approximately one-hundred nanoseconds (100 ns). These example implementations are illustrative of a few specific implementations of the present disclosure, other implementations may use different or similar technology and/or synthesize slopes of different periods.

Implementations of the present disclosure may provide an oscillator that is temperature stable, can maintain the emitted radiation within a given frequency band, and can be enabled and disabled while settling to a correct output frequency within less than five (5) pulses of the high frequency signal VHF. Another example implementation may use a low frequency on-chip RC oscillator in combination with a PLL circuit.

Although various implementations of the claimed invention have been described above with a certain degree of particularity, or with reference to one or more individual implementations, those skilled in the art could make numerous alterations to the disclosed implementations without departing from the spirit or scope of the claimed invention. The use of the terms "approximately" or "substantially" means that a value of an element has a parameter that is expected to be close to a stated value or position. Further, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more implementations of the present disclosure. It is also to be appreciated that the terms "top" and "bottom", "left" and "right", "up" or "down", "first", "second", "next", "last", "before", "after", and other similar terms are used for description and ease of reference purposes and are not intended to be limiting to any orientation or configuration of any elements or sequences of operations for the various implementations of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an implementation of the present disclosure. Other implementations are therefore contemplated. It is intended that all matter contained in the above description and shown in the accompanying drawings shall be interpreted as illustrative of implementations and not limiting. Changes in detail or structure may be made without departing from the basic elements of the invention as defined in the following claims.

What is claimed is:

1. A circuit, comprising:
  a voltage-controlled oscillator configured to generate a high frequency signal based on a control signal;
  a dummy load parallel to the voltage-controlled oscillator and configured to receive the control signal via a switch, the dummy load being configured to dissipate energy in the control signal when the voltage-controlled oscillator is in an OFF state; and
  a digital-to-analog converter coupled to the voltage-controlled oscillator, the control signal being generated based on an output of the digital-to-analog converter.

2. The circuit of claim 1, wherein the output of the digital-to-analog converter is an adjustment signal.

3. The circuit of claim 1, further comprising:
  a digital filter coupled to the voltage-controlled oscillator and configured to receive the high frequency signal, the digital-to-analog converter configured to output an adjustment signal based on a data signal from the digital filter.

4. A circuit, comprising:
  a voltage-controlled oscillator configured to generate a high frequency signal based on a control signal:
  a dummy load parallel to the voltage-controlled oscillator and configured to receive the control signal via a first switch;
  a digital-to-analog converter coupled to the voltage-controlled oscillator, the control signal being generated based on an output of the digital-to-analog converter; and
  a second switch disposed between the voltage-controlled oscillator and the digital-to-analog converter.

5. The circuit of claim 4, wherein the voltage-controlled oscillator is switchably coupled within a timing circuit.

6. A circuit, comprising:
  a voltage-controlled oscillator configured to generate a high frequency signal based on a control signal;
  a dummy load parallel to the voltage-controlled oscillator and configured to receive the control signal via a switch; and
  a digital-to-analog converter coupled to the voltage-controlled oscillator, the control signal being generated based on an output of the digital-to-analog converter, the voltage-controlled oscillator being switchably coupled within a feedback loop with the digital-to-analog converter.

7. The circuit of claim 6, further comprising:
  an adjustable current converter coupled, at an input terminal, to a power source and configured to generate the control signal, the adjustable current converter configured to adjust the control signal based on an adjustment signal received from the digital-to-analog converter.

8. The circuit of claim 1, wherein the voltage-controlled oscillator is included in a timing circuit, and is configured to output the high frequency signal while the timing circuit is enabled.

9. An apparatus, comprising:
  a voltage-controlled oscillator included in a timing circuit and configured to generate a high frequency signal based on a control signal;
  a dummy load switchably coupled within the timing circuit; and
  a digital-to-analog converter coupled to the voltage-controlled oscillator and configured to cause an adjustment of the control signal, the voltage-controlled oscillator having an impedance substantially equal to an impedance of the dummy load.

10. The apparatus of claim 9, wherein the voltage-controlled oscillator is switchably coupled within a feedback loop with the digital-to-analog converter.

11. An apparatus, comprising:
  a voltage-controlled oscillator included in a timing circuit and configured to generate a high frequency signal based on a control signal;
  a dummy load switchably coupled within the timing circuit;
  a digital-to-analog converter coupled to the voltage-controlled oscillator and configured to cause an adjustment of the control signal; and
  a digital filter configured to transmit a switching signal to the voltage-controlled oscillator and the dummy load.

12. The apparatus of claim 11, wherein the voltage-controlled oscillator is configured to provide a voltage-controlled oscillator impedance to the control signal while the dummy load is configured to provide a dummy load impedance to the control signal.

13. The apparatus of claim 9, further comprising:
  a digital filter coupled to the voltage-controlled oscillator and configured to receive the high frequency signal, the digital filter including:
    a ripple counter configured to receive the high frequency signal; and
    a logic control circuit configured to output a switching signal that drives the voltage-controlled oscillator and the dummy load.

14. The apparatus of claim 9, wherein the voltage-controlled oscillator is configured to generate the high frequency signal with a specified period.

15. The apparatus of claim 9, wherein digital filter is configured to:
   divide the high frequency signal to generate a low frequency signal;
   count a number of pulses in the low frequency signal until an overflow condition is satisfied; and
   output an overflow signal to a logic control circuit in response to the overflow condition being satisfied.

16. A method, comprising:
   enabling a voltage-controlled oscillator within a timing circuit to receive a control signal, the voltage-controlled oscillator configured to generate a high frequency signal based on the control signal;
   switchably disconnecting a dummy load within the timing circuit such that the dummy load is isolated from the control signal;
   adjusting the control signal using a digital-to-analog converter coupled to the voltage-controlled oscillator;
   switchably disconnecting the voltage-controlled oscillator such that the voltage-controlled oscillator is isolated from the control signal; and
   enabling the dummy load to receive the control signal such that the dummy load dissipates energy in the control signal.

17. The method of claim 16, further comprising:
   modifying, by the voltage-controlled oscillator, a center frequency of the high frequency signal in response to the adjusting the control signal.

\* \* \* \* \*